(12) United States Patent
Brunner et al.

(10) Patent No.: US 7,012,017 B2
(45) Date of Patent: Mar. 14, 2006

(54) PARTIALLY ETCHED DIELECTRIC FILM WITH CONDUCTIVE FEATURES

(75) Inventors: Dennis M. Brunner, Centralia, MO (US); David L. Buster, Columbia, MO (US); Michael S. Graff, Columbia, MO (US); Daniel K. Luebbert, Columbia, MO (US); Nathan P. Kreutter, Austin, TX (US); Rui Yang, Austin, TX (US); Guoping Mao, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/791,966

(22) Filed: Mar. 3, 2004

(65) Prior Publication Data

US 2005/0167829 A1 Aug. 4, 2005

Related U.S. Application Data

(60) Provisional application No. 60/539,959, filed on Jan. 29, 2004.

(51) Int. Cl.
*H01L 21/44* (2006.01)
*H01L 21/48* (2006.01)
*H01L 21/50* (2006.01)
*H01L 21/302* (2006.01)

(52) U.S. Cl. ............ 438/613; 438/125; 438/614; 438/652; 438/667; 438/672; 438/713; 257/737; 257/702; 257/750; 257/692

(58) Field of Classification Search ........ 438/613, 438/614, 125, 652, 667, 672, 713; 257/737, 257/702, 692, 750
See application file for complete search history.

(56) References Cited

U.S. PATENT DOCUMENTS

| | | | |
|---|---|---|---|
| 5,227,008 A | 7/1993 | Klun et al. | |
| 5,248,446 A * | 9/1993 | Uchida et al. | 252/299.01 |
| 5,401,913 A | 3/1995 | Gerber et al. | |
| 5,747,358 A | 5/1998 | Gorrell et al. | |
| 6,077,560 A | 6/2000 | Moshrefzadeh et al. | |
| 6,085,414 A | 7/2000 | Swarbrick et al. | |
| 6,097,097 A * | 8/2000 | Hirose | 257/778 |
| 6,222,136 B1 | 4/2001 | Appelt et al. | |
| 6,307,159 B1 | 10/2001 | Soejima et al. | |
| 6,313,402 B1 | 11/2001 | Schreiber et al. | |
| 6,322,903 B1 | 11/2001 | Siniaguine et al. | |
| 6,375,062 B1 | 4/2002 | Higdon et al. | |
| 6,403,211 B1 | 6/2002 | Yang et al. | |
| 6,537,854 B1 | 3/2003 | Chang et al. | |
| 6,555,908 B1 | 4/2003 | Eichelberger et al. | |
| 6,611,046 B1 | 8/2003 | Yang | |
| 6,848,176 B1 * | 2/2005 | Hishinuma et al. | 29/846 |
| 2002/0028293 A1 | 3/2002 | Yang et al. | |

(Continued)

FOREIGN PATENT DOCUMENTS

EP 0 388 312 9/1990

(Continued)

OTHER PUBLICATIONS

Search Report for PCT/US2005/001341.

(Continued)

*Primary Examiner*—Nitin Parekh
(74) *Attorney, Agent, or Firm*—Melanie G. Gover (57) ABSTRACT

Provided are partially etched dielectric films with raised conductive features. Also provided are methods for forming the raised conductive features in the dielectric films, which methods include partially etching the dielectric films.

25 Claims, 4 Drawing Sheets

U.S. PATENT DOCUMENTS

| | | |
|---|---|---|
| 2002/0084513 A1 | 7/2002 | Siniaguine |
| 2002/0115290 A1 | 8/2002 | Halahan et al. |
| 2002/0155280 A1 | 10/2002 | Yang |
| 2003/0116866 A1 | 6/2003 | Khng et al. |
| 2004/0046835 A1 | 3/2004 | Yang et al. |
| 2004/0094512 A1* | 5/2004 | Ono et al. .................. 216/83 |
| 2004/0097694 A1* | 5/2004 | Fujihara et al. ............ 528/335 |

FOREIGN PATENT DOCUMENTS

| | | |
|---|---|---|
| EP | 0 507 332 A2 | 10/1992 |
| EP | 1 005 086 | 5/2000 |
| EP | 0 697 278 B1 | 4/2001 |
| WO | WO 01/56771 A2 | 8/2001 |
| WO | WO 02/03767 | 1/2002 |
| WO | WO 02/100135 A2 | 12/2002 |

OTHER PUBLICATIONS

Delphi Connection Systems, "Gold Dot™ Technology" publication, copyright 1999-2000.

Delphi Connection Systems, "Gold Dot™ speed, density and reliabilty", publication copyright 1999-2000.

* cited by examiner

PARTIALLY ETCHED DIELECTRIC FILM WITH CONDUCTIVE FEATURES

This application claims priority to U.S. provisional patent application No. 60/539,959, filed Jan. 29, 2004, which is hereby incorporated by reference.

FIELD

The invention relates to formation of connective, conductive features on flexible printed circuits by partially etching dielectric films.

BACKGROUND

An etched copper or printed conductive circuit pattern on a polymer film base may be referred to as a flexible circuit or as flexible printed wiring board. Originally designed to replace bulky wiring harnesses, flexible circuitry is often the only solution for the miniaturization and movement needed for current, cutting-edge electronic assemblies. Thin, lightweight and ideal for complicated devices, flexible circuit design solutions range from single-sided conductive paths to complex, multilayer three-dimensional packages.

Commonly used dielectric film base materials for flexible electronic packaging include polyimide, polyester terephthalate (PET), random-fiber aramid, and polyvinyl chloride. Changes in electronic device design create the need for materials with properties or design possibilities surpassing previously attainable performance and processing capabilities. For example, a lower dielectric constant allows faster electrical signal transfer, good thermal performance facilitates cooling for a package, a higher glass transition or melting temperature improves package performance at higher temperature, and lower moisture absorption leads to signal and data processing at higher and higher frequencies.

Polyimide film is a commonly used substrate for flexible circuits that fulfill the requirements of complex, cutting-edge electronic assemblies. The film has excellent properties such as thermal stability and low dielectric constant. Liquid crystal polymer (LCP) films represent suitable materials as substrates for flexible circuits having improved high frequency performance, lower dielectric loss, and lower moisture absorption than polyimide films.

Flexible circuits may also include circuit connecting features that fall under the general term "conductive bumps" such as those present in contact sets, also referred to as interposers, which provide temporary interconnection for example between integrated circuit testers and devices under test (DUT), during test and burn in. Other structures of this type include integrated circuit probes, and compression bumped connectors involving flex circuit-to-flex circuit, or flex circuit to circuit board interconnection.

SUMMARY

An aspect of the present invention provides a process for forming a conductive bump attached to a dielectric film, said process comprising: providing a dielectric film having a first side, a second side and at least one via filled by a metal plug having a planar surface exposed at said first side of the dielectric film; controllably etching the dielectric film from around the planar surface of the metal plug to provide a dielectric film having a metallic projection protruding therefrom. In the process, an array of vias may be filled with metal plugs and the controlled etching may provide an array of co-planar metallic projections. In the process, an array of vias may be filled with metal plugs and the controlled etching may provide an array of metallic projections surrounded by a dielectric mask. The process may further comprise depositing metal on the metallic projection to produce the conductive bump extending out from the metallic projection to cover a portion of the etched surface. In the process, the dielectric film may comprise a polycarbonate polymer, liquid crystal polymer and/or a polyimide copolymer including carboxylic ester structural units in the polymeric backbone. The liquid crystal polymers may be copolymers containing p-phenyleneterephthalamide and/or copolymers containing p-hydroxybenzoic acid. The polyimide copolymers may be the reaction product of monomers including p-phenylene bis(trimellitic acid monoester anhydride). In the process, controllably etching the dielectric film may include using a chemical milling reagent including an alkali metal hydroxide. The chemical milling reagent may further include an amine. The alkali metal hydroxide may be potassium hydroxide and the amine may be ethanolamine.

Another aspect of the present invention provides a process for forming a conductive bump protruding from a dielectric film, said process comprising: providing a dielectric film having a first side and a second side; applying a stop layer to at least the first side of the dielectric film, the stop layer having an underside in contact with the first side of the dielectric film; forming a cavity in the dielectric film that extends through the dielectric film from the second side of the dielectric film to the stop layer; depositing conductive material to form a conductive plug in the cavity; removing the stop layer from the first side of the dielectric film to expose a surface of the conductive plug; controllably etching the dielectric film from around the conductive plug surface to form the conductive bump protruding from the dielectric film. The process may further comprise depositing metal on the conductive bump such that it extends out in x and y directions lateral to the vertical axis of the bump to cover a portion of the etched dielectric surface. In the process, an array of cavities may be filled with metal plugs and the controlled etching may provide an array of co-planar metallic projections. In the process, an array of cavities may be filled with metal plugs and the controlled etching may provide an array of metallic projections surrounded by a dielectric mask. In the process, the stop layer may be a metal layer, such as a flash-plated metal layer. In the process, the dielectric film may comprise a polycarbonate polymer, liquid crystal polymer and/or a polyimide copolymer including carboxylic ester structural units in the polymeric backbone.

Another aspect of the present invention provides a process for forming a conductive bump protruding from a dielectric film, the process comprising: providing a dielectric film having a first side and a second side; forming an opening in the dielectric film that extends through the dielectric film from the first side to the second side of the dielectric film; applying a stop layer to the second side of the dielectric film such that the opening is closed off by the stop layer on the side of the opening adjacent the second side, thereby forming a cavity; depositing conductive material to form a conductive plug in the cavity; removing the stop layer from the second side of the dielectric film to expose a surface of the conductive plug; and controllably etching the dielectric film from around the conductive plug surface to form the conductive bump protruding from the dielectric film. The process may further comprise depositing metal on the conductive bump such that it extends out in x and y directions to cover a portion of the etched dielectric surface. In the process, an array of cavities may be filled with metal plugs and the controlled etching may provide an array of co-planar metallic projections. In the process, an array of cavities may be filled with metal plugs and the controlled etching may provide an array of metallic projections surrounded by a dielectric mask. In the process, the stop layer may be a polymer resin layer. The dielectric film may comprise a polycarbonate polymer, liquid crystal polymer and/or a polyimide copolymer including carboxylic ester structural units in the polymeric backbone.

Another aspect of the present invention provides an article for providing an electrical connection between at least a pair of electronic components, the article comprising: a dielectric film having a first side, a second side and at least one metal-filled via, the dielectric film further having an etched film portion on at least the first side, the etched film portion including an etched surface adjacent to the metal filled via; and a conductive bump extending upward from the at least one metal-filled via at the first side of the dielectric film, the conductive bump providing electrical connection to one of the at least a pair of electronic components. In the article, the conductive bump may extend outwardly in x and y directions lateral to the vertical axis of the bump from the at least one metal-filled via to cover a portion of the etched surface. The article may comprise an array of co-planar conductive bumps. The array of co-planar conductive bumps may be surrounded by the partially etched dielectric film thereby forming a non-conductive mask around the conductive bumps.

An advantage of some embodiments of flexible circuits of the present invention is that they have both surface uniformity of the dielectric film, after controlled thickness processing, and uniform, planar bump contacts that improve electrical continuity of interconnected features.

An advantage of some embodiments of the present invention is that the use of planar bump contacts allows interconnect structures having finer pitch than previously known, similar structures.

An advantage of some embodiments of the present invention is that the conductive bumps and other conductive elements are substantially aligned without the need for registration.

DETAILED DESCRIPTION

Unless otherwise stated, concentrations of components are presented herein in terms of wt %.

As required, details of the present invention are disclosed herein; however, it is to be understood that the disclosed embodiments are merely exemplary. Therefore, specific structural and functional details disclosed herein are not to be interpreted as limiting, but merely as a basis for the claims and as a representative basis for teaching one skilled in the art to variously employ the present invention.

The starting dielectric film for the flexible circuits according to the present invention can be standard polyimide, liquid crystal polymer, or polycarbonate dielectric films, e.g., generally about 12.5 $\mu$m to about 175 $\mu$m, typically about 25 $\mu$m or about 50 $\mu$m thick. This allows implementation of conventional web handling for forming flexible printed circuits. During the multi-step circuit forming process, the dielectric film may be selectively reduced in thickness, to form thinned regions. However, typically before a thinning step, additional layers are added to the structure, so that the thinning of the substrate does not substantially affect handling.

Processes including chemical etching, also referred to herein as chemical milling, are suitable for partially removing regions in flexible circuits comprising polyimide, polycarbonate polymer, or liquid crystal polymer substrates according to the present invention. Chemical milling techniques are appropriate for use with either batch or continuous manufacturing schemes for producing flexible printed circuits.

Formation of one or more vias in a dielectric film may use a technique selected from chemical milling, mechanical drilling and laser ablation. The vias are then filled with conductive material. Stop layers of metal or polymer resin may be used to facilitate the formation of filled vias. The dielectric film may then be partially etched to form one or more conductive bumps that protrude from the dielectric film.

When chemical milling is used for via formation, the following multi-step process provides a conductive bump attached to a dielectric film. The process comprises a number of steps including providing a dielectric film having a first side and a second side. A layer of metal, applied to at least the first side of the dielectric film, has an underside in contact with the first side of the dielectric film. A tie layer may exist between the dielectric and metal layer. After applying a layer of uncured photoresist to the second side of the dielectric film, exposure of the uncured photoresist to a pattern of radiation provides cured photoresist except in at least one portion. Developer applied to the uncured photoresist removes it from the at least one portion. An etchant applied to the at least one portion to provides a cavity in the dielectric film. The cavity is essentially a via extending through the dielectric layer to the underside of the layer of metal. The via typically has a substantially cone-shaped or cylinder-shaped wall.

Applying a conductive seed layer to the via wall and the underside of the layer of metal activates the cavity for metal deposition to provide a metal plug filling the via. The metal plug has a substantially planar surface where it abuts the layer of metal attached to the first side of the dielectric film. At the opposite end of the via, the metal plug may extend out of the via and overlap the second side of the dielectric film.

Removing the layer of metal from the first side of the dielectric film exposes the substantially planar surface of the metal plug. It also exposes the first side of the dielectric film. This first side of the dielectric film can then be controllably etched from around the planar surface of the metal plug to provide a dielectric film having a metallic projection protruding therefrom. Optional additional deposition of metal on the metallic projection can produce a conductive bump extending out in the x and y directions (as well as in the z direction) from the metallic projection to cover a portion of the etched film surface. This formation can enhance retention of the plug in the via.

An article according to the present invention may have use as an electrical connector between at least a pair of electronic components. For example, it can be used as a test probe, an interposer, a die attachment means in a chip package, and an electrical contact in a burn-in test socket, all of which are generally known in the art.

Processing of flexible circuits according to the present invention has similarities to the process of U.S. Pat. No. 5,227,008 that describes processing of polyimide films to produce through holes, such as vias, and related voids. This patent and the present application are commonly owned. Etching capabilities to produce flexible printed circuits having partially etched regions require specification of materials and process capabilities not previously disclosed. For example, although polyimide is the most frequently used substrate material used in the manufacture of flexible circuits, patterning of dielectric substrates is primarily accomplished by such process steps as mechanical punching or drilling and laser ablation. Complete removal of polyimide material, for hole formation, is relatively common. As described in U.S. Pat. No. 5,227,008 it is possible to produce chemically etched vias and through holes in flexible polyimide circuits, as needed for electrical interconnection between the circuit and a printed circuit board. However, controlled etching without hole formation is very difficult because commonly used polyimide films swell uncontrollably in the presence of conventional etchant solutions. Most commercially available polyimide film comprises monomers of pyromellitic dianhydride (PMDA), or oxydianiline (ODA), or biphenyl dianhydride (BPDA), or phenylene diamine (PPD). Polyimide polymers including one or more of these monomers may be used to produce film products such as those available under the trade names KAPTON H, K, E from E. I. du Pont de Nemours and Company, Circleville, Ohio, and APICAL AV, NP from Kaneka Corporation, Tokyo, Japan. Films of this type swell in the presence of conventional chemical etchants. Swelling changes the thickness of the film and may cause localized delamination of resist. This can lead to loss of control of etched film thickness and irregular shaped features due to etchant migration into the delaminated areas.

Controlled etching of films, according to the present invention, is most successful with substantially non-swelling polymers. "Substantially non-swelling" refers to a film that swells by such an insignificant amount when exposed to an alkaline etchant as to not hinder the thickness-reducing action of the etching process. For example, when exposed to some etchant solutions, some of the polyimides described above will swell to such an extent that their thickness cannot be effectively controlled in reduction.

In contrast to other known polyimide films there is evidence to show controllable thinning of APICAL HPNF films (available from Kaneka Corporation, Otsu, Japan). The existence of carboxylic ester structural units in the polymeric backbone of non-swelling APICAL HPNF film signifies a difference between this polyimide and other polyimide polymers that are known to swell in contact with alkaline etchants.

APICAL HPNF polyimide film is believed to be a copolymer that derives its ester unit containing structure from polymerizing of monomers including p-phenylene bis(trimellitic acid monoester anhydride). Other ester unit containing polyimide polymers are not known commercially. However, to one of ordinary skill in the art, it would be reasonable to synthesize other ester unit containing polyimide polymers depending upon selection of monomers similar to those used for APICAL HPNF. Such syntheses could expand the range of polyimide polymers for films, which, like APICAL HPNF, may be controllably etched. Materials that may be selected to increase the number of ester containing polyimide polymers include 1,3-diphenol bis(anhydro-trimellitate), 1,4-diphenol bis(anhydro-trimellitate), ethylene glycol bis(anhydro-trimellitate), biphenol bis(anhydro-trimellitate), oxy-diphenol bis(anhydro-trimellitate), bis(4-hydroxyphenyl sulfide) bis(anhydro-trimellitate), bis(4-hydroxybenzophenone) bis(anhydro-trimellitate), bis(4-hydroxyphenyl sulfone) bis(anhydro-trimellitate), bis(hydroxyphenoxybenzene), bis(anhydro-trimellitate), 1,3-diphenol bis(aminobenzoate), 1,4-diphenol bis(aminobenzoate), ethylene glycol bis(aminobenzoate), biphenol bis(aminobenzoate), oxy-diphenol bis(aminobenzoate), bis(4-aminobenzoate) bis(aminobenzoate), and the like.

Polyimide films may be etched using solutions of potassium hydroxide or sodium hydroxide alone, as described in U.S. Pat. No. 6,611,046 B1, or using alkaline etchant containing a solubilizer.

Liquid crystal polymer (LCP) films represent suitable materials as substrates for flexible circuits having improved high frequency performance, lower dielectric loss, better chemical resistance, and less moisture absorption than polyimide films.

LCP films represent suitable materials as substrates for flexible circuits having improved high frequency performance, lower dielectric loss, and less moisture absorption than polyimide films. Characteristics of LCP films include electrical insulation, moisture absorption less than 0.5% at saturation, a coefficient of thermal expansion approaching that of the copper used for plated through holes, and a dielectric constant not to exceed 3.5 over the functional frequency range of 1 kHz to 45 GHz. These beneficial properties of liquid crystal polymers were known previously but difficulties with processing prevented application of liquid crystal polymers to complex electronic assemblies. The etchant with solubilizer described herein makes possible the use of LCP film for flexible circuits.

Non-swelling films of liquid crystal polymers comprise aromatic polyesters including copolymers containing p-phenyleneterephthalamide such as BIAC film (Japan Gore-Tex Inc., Okayama-Ken, Japan) and copolymers containing p-hydroxybenzoic acid such as LCP CT film (Kuraray Co., Ltd., Okayama, Japan).

Films of liquid crystal polymers, all of which exhibit this property, comprise aromatic polyesters including copolymers containing p-phenyleneterephthalamide such as that available under the trade name BIAC from Japan Gore-Tex Inc., Okayama-Ken, Japan and copolymers containing p-hydroxybenzoic acid such as that available under the trade name LCP CT from Kuraray Co., Ltd., Okayama, Japan. A similarity between liquid crystal polymers and APICAL HPNF polyimide is the presence of carboxylic ester units in both types of polymer structures.

Examples of suitable polycarbonate films, include substituted and unsubstituted polycarbonates, such as those available under the trade name LEXAN from GE Plastics, Pittsfield, Mass., available under the trade name ZELUX from Westlake Plastics Company, Lenni, Pa., and available under the trade name MAKROFOL from Bayer Plastics Div., Pittsburgh, Pa.; polycarbonate blends such as polycarbonate/aliphatic polyester blends, including the blends available under the trade name XYLEX from GE Plastics, Pittsfield, Mass., polycarbonate/polyethyleneterephthalate (PC/PET) blends, polycarbonate/polybutyleneterephthalate (PC/PBT) blends, and polycarbonate/poly(ethylene 2,6- naphthalate) (PC/PEN) blends, and any other blend of polycarbonate with a thermoplastic resin; and polycarbonate copolymers such as polycarbonate/polyethyleneterephthalate(PC/PET), polycarbonate/polyetherimide (PC/PEI), and the like.

A similarity between the polycarbonate, liquid crystal polymers, and APICAL HPNF polyimide is the presence of carboxylic ester units in each type of polymer structures. The existence of carboxylic ester structural units in the polymeric backbone of non-swelling APICAL HPNF film signifies a difference between this polyimide and other polyimide polymers that are known to swell in contact with alkaline etchants.

APICAL HPNF polyimide film is believed to be a copolymer that derives its ester unit containing structure from polymerizing of monomers including p-phenylene bis(trimellitic acid monoester anhydride). Other ester units containing polyimide polymers are not known commercially. However, to one of ordinary skill in the art, it would be reasonable to synthesize other ester unit containing polyimide polymers depending upon selection of monomers similar to those used for APICAL HPNF. Such syntheses could expand the range of polyimide polymers for films, which, like liquid crystal polymers and APICAL HPNF, may be controllably etched. Materials that may be selected to increase the number of ester containing polyimide polymers include 1,3-diphenol bis(anhydro-trimellitate), 1,4-diphenol bis(anhydro-trimellitate), ethylene glycol bis(anhydro-trimellitate), biphenol bis(anhydro-trimellitate), oxy-diphenol bis(anhydro-trimellitate), bis(4-hydroxyphenyl sulfide) bis (anhydro-trimellitate), bis(4-hydroxybenzophenone) bis(anhydro-trimellitate), bis(4-hydroxyphenyl sulfone) bis(anhydro-trimellitate), bis(hydroxyphenoxybenzene), bis (anhydro-trimellitate), 1,3-diphenol bis(aminobenzoate), 1,4-diphenol bis(aminobenzoate), ethylene glycol bis(aminobenzoate), biphenol bis(aminobenzoate), oxy-diphenol bis(aminobenzoate), bis(4 aminobenzoate) bis(aminobenzoate), and the like.

Dielectric substrates, such as polycarbonate, liquid crystal polymer, and polyimide films having a thickness between about 12.5 $\mu$m and about 175 $\mu$m, typically about 25 $\mu$m or about 50 $\mu$m thick, provide suitable starting materials for circuits of the present invention. Materials in this thickness range are suitable for handling by equipment used to produce conventional flexible circuits of the type described in U.S. Pat. No. 5,227,008.

Process steps for selectively and controllably thinning materials according to the present invention include etching of substantially filly cured polymeric films of polycarbonate, liquid crystal polymers, and polyimide polymers containing carboxylic ester units, e.g., using p-phenylene bis(trimellitic acid monoester anhydride) as a comonomer. The etching step of the process involves contacting unmasked areas of the polymeric film with a concentrated alkaline etching fluid. Useful alkaline etchants include aqueous solutions of alkali metal hydroxides and their mixtures with amines, as described in U.S. Pat. Nos. 5,227,008 and 6,403,211 B1. Time requirements for controlled thinning of dielectric film depend upon the type and thickness of the polymeric film. Film etching, using an alkaline etchant heated between 50° C. and 120° C. typically requires a time from about 10 seconds to about 20 minutes. Dwell time of the dielectric film in the etchant determines how much of the film is removed.

The process steps described above may be conducted as a batch process using individual steps or in automated fashion using equipment designed to transport a web material through the process sequence from a supply roll to a wind-up roll, which collects mass produced circuits that include selectively thinned regions and indentations of controlled depth in the polymer film. Automated processing uses a web handling device that has a variety of processing stations for applying, exposing and developing photoresist coatings, as well as etching and plating the metallic parts and etching the polymer film of the starting metal to polymer laminate. Etching stations include a number of spray bars with jet nozzles that spray etchant on the moving web to etch those parts of the web not protected by crosslinked photoresist.

The following description provides detail of conductive bump formation in a single via formed in the dielectric film. It will be appreciated that a number of such bumps may be positioned at any point in the film depending upon the design of a printed circuit or related device such as an interposer. Processes for bump formation according to the present invention can provide a substantially planar, conductive bump projecting from a substantially uniform dielectric layer. Individual bump planarity and co-planarity among adjacent bumps are useful for improving electrical continuity between touching conductive contacts. Contacts having improved electrical continuity facilitate formation of bumped flex structures, e.g. interposers, of much finer pitch than any available previously.

Figure 1A:
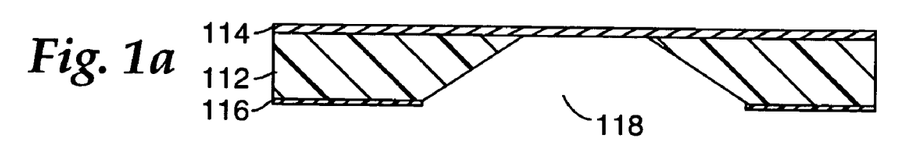
FIGS. 1a–1f illustrate a method of the present invention.

FIGS. 1a–1f illustrate a method of the present invention for forming conductive bumps. A dielectric film 112 having a layer of metal 114, typically a flash plated layer of copper, on a first side is provided. An intervening tie layer (not shown), such as chrome or chrome alloys, may exist between the dielectric and metal layer to enhance the bond strength of the dielectric film to the metal layer. Chemical milling, mechanical drilling, or laser ablation may be used to form a via in the dielectric film. This via formation step does not remove the original metal layer, as illustrated in FIG. 1a.

The dielectric film may comprise a polyimide, such as APICAL HPNF, polycarbonate, or liquid crystal polymer. Via formation in the dielectric film, using a chemical milling technique involves application of photoresist material 116 to the second film surface opposite that covered by the continuous layer of flash plated copper.

In a typical process, aqueous processable photoresist material, applied to the dielectric side of the copper-on-polymeric film laminate, becomes crosslinked during exposure to a pattern of ultraviolet radiation or the like, through a mask. The exposed photoresist is then developed using a dilute aqueous solution, e.g. a 0.5% to 1.5% alkali metal carbonate solution, until desired patterns are developed that identifies the location of one or more vias 118. The process continues with immersion of the laminate in a bath of concentrated alkaline etchant solution at a temperature between 50° C. and 120° C. This etches selected areas not covered by crosslinked photoresist. The exposed areas of dielectric film are removed by chemical milling to provide the desired vias through the film.

The step of chemical milling uses an aqueous solution of alkali metal hydroxide or mixture of alkali metal hydroxide and amine, such as ethanolamine, to dissolve dielectric material to produce a cavity that is closed on the first side by the continuous layer of metal. The metal layer resists the aqueous alkaline solution used to remove dielectric material. In this way the metal layer provides a planar closure over one end of a via, which extends through the dielectric material. The metal layer acts as a plating stop during subsequent deposition steps and shapes the material being deposited, such as a metal or suitable conductive filler, as it accumulates in the cavity or via. The residence time in the chemical milling etchant bath, to produce vias in the polymeric film, is from about 10 seconds to about 20 minutes.

A dilute aqueous solution, containing from 2% to 5% alkali metal carbonate, may then be used at temperatures from about 20° C. to about 80° C., preferably about 20° C. to about 60° C., to strip the crosslinked resist 116 from the laminate. A protective photoresist layer is laminated to the first flash plated Cu side to prevent deposition of additional metal in subsequent plating processes.

Figure 1B:
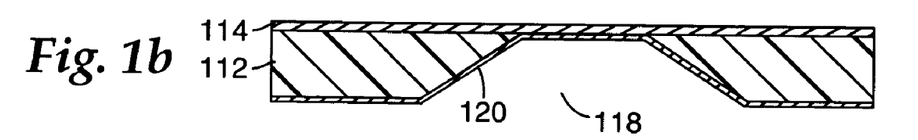

After via surface cleaning to remove chemical milling contaminants, a variety of known techniques, including sputtering of conductive materials (carbon or metal), immersion coating of conductive carbon, and immersion electroplating or electroless plating of metal may be used to deposit a conductive seed layer 120 (not shown in subsequent figures) on the surfaces of the closed cavity produced by chemical milling, as illustrated in FIG. 1b. One suitable method of depositing a conductive seed layer is the "direct metallization" method described at p. 9, line 19 to p. 10, line 20 of Applicant's co-pending PCT Patent Application having International Publication No. WO 02/03767. The seed layer is typically about 10 to about 200 nm (about 100 to about 2000 Å) thick, but can be whatever thickness is suitable for the intended use. Seeding provides an active surface upon which to build a thickness of metal, usually copper, by electroless plating, electrolytic plating or a combination of the two.

The plating process first requires application of photoresist (not shown) to the second side of the dielectric material. Exposure and development of a desired pattern provides openings over the seeded cavities formed previously in the dielectric film as well as the desired circuit pattern.

Figure 1C:
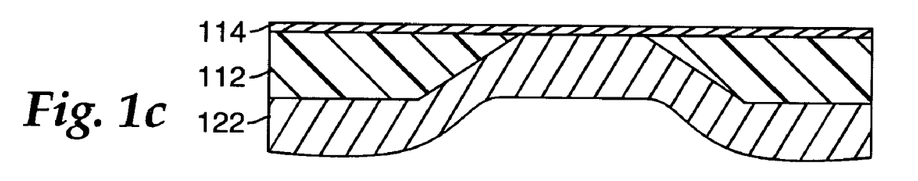

Deposition of a suitable conductive material 122, e.g., copper, in the cavities uses a suitable metal plating technique, until the cavity is filled to a desired depth. Typically a layer of metal will extend onto the surface of the dielectric film outside the edges of the cavity, as illustrated in FIG. 1c, to form metal traces. As the cavity fills with metal, the planar underside of the metal layer acts as a barrier or backstop to which the depositing metal conforms. The backstop confines the conductive filler so that it forms a substantially planar face that is coplanar with the first side of the dielectric film. Suitable plating conditions include a current density between about 0.005 amp/$cm^2$ (5 amps/$ft^2$) and about 0.08 amp/$cm^2$ (75 amps/$ft^2$) applied at a temperature from about 25° C. to about 50° C. All photoresist is then removed.

Figure 1D:
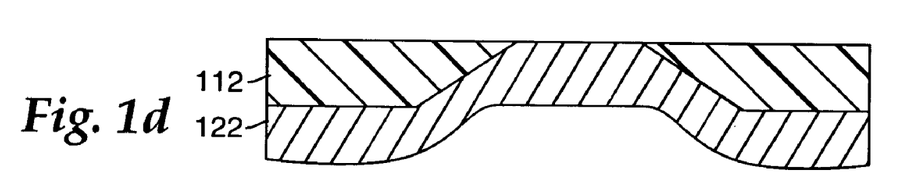

Subsequent to the circuit/via-fill plating, all exposed flash Cu and tie layer on both sides of the dielectric film, is removed to expose a surface of the plated metal filling the via, as illustrated in FIG. 1d. Removal of the metal layer may be done with an etchant that is commercially available under the trade name PERMA-ETCH from Electrochemicals Inc., Maple Plain, Minn.

It should be noted that subsequent steps do not require application of photoresist material. This overcomes a problem with current technology that requires bump plating up through photoresist thereby subjecting an entire bump to varying current density. Non-uniform current density leads to non-uniform bumps.

Figure 1E:
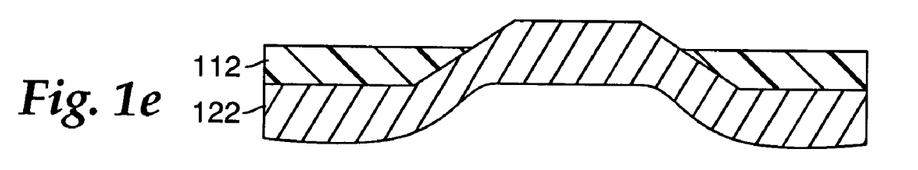
Figure 3:
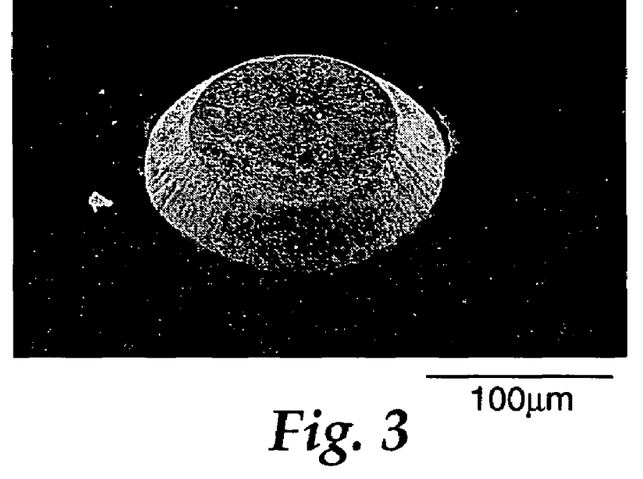
FIG. 3 is a digital image of a conductive bump made by a method of the present invention.

As illustrated in FIG. 1e, conductive bump formation proceeds using chemical milling for controlled thinning of the dielectric film. A chemical milling reagent, such as an aqueous solution of alkali metal hydroxide or mixture of alkali metal hydroxide and amine such as ethanolamine, selectively removes dielectric material from the side of the dielectric film, e.g., polyimide, liquid crystal polymer, or polycarbonate, that was previously protected by the flash metal layer. Exemplary chemical milling reagents contain about 45% aqueous hydroxide or a mixture of 40% potassium hydroxide and 20% ethanolamine. As the thickness of the dielectric film decreases, the plated metal in the via protrudes from the film surface as a frustum-shaped projection having a planar surface substantially equal in area to, or smaller than, (depending on the slope of the via walls) the diameter of the via, as shown in FIG. 3. In this manner, a conductive bump in a dielectric layer is formed.

If not all of the exposed substrate is to be etched to the same depth, partial removal may require lamination of photoresist to both sides of the flexible circuit followed by exposure to crosslink the photoresist according to a selected pattern. Development of the photoresist, using the dilute solution of alkali metal carbonate described previously, exposes areas of the dielectric film that will be etched to controlled depths to produce thinned regions of film. After allowing sufficient time to etch a desired depth into the dielectric substrate of the flex circuit, the protective crosslinked photoresist is stripped as before, and the resulting circuit, including selectively thinned regions, is rinsed clean.

Figure 1F:
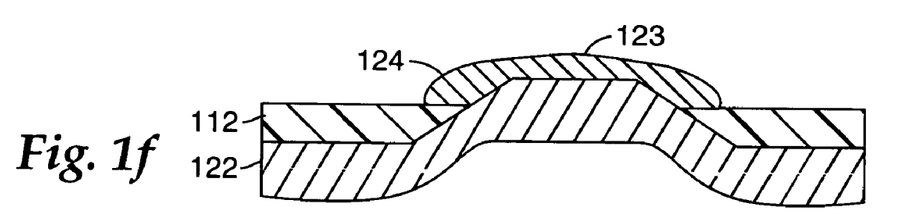
Figure 4:
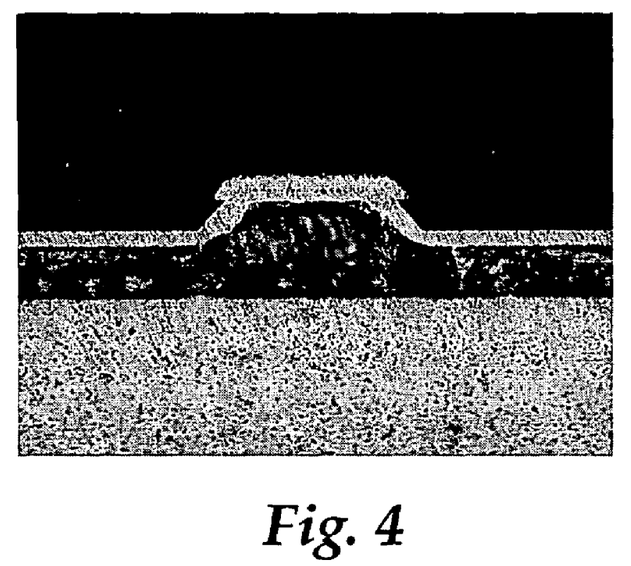
FIG. 4 is a digital image of a cross-section of a conductive bump made by another method of the present invention.

An optional subsequent step is to over-plate the conductive bump, for example with gold or nickel/gold, to form a "cap" 123 on the conductive bump. Over-plating can increase the size of the portion of the bump protruding from the dielectric film layer. Caps formed according to this optional step may include portions 124 that extend outward in the x and y directions laterally to the vertical axis of the bump, where "vertical axis" means an axis substantially perpendicular to the plane of a major surface of the dielectric film layer. The extended portions may overlap the circumference of each filled via on opposite sides of the dielectric film, as illustrated in FIG. 1f. The overlapping portions hold the bumps in place to protect them from being dislodged. A conductive bump made by this method is shown in FIG. 4.

The conditions of over-plating vary depending on the metal applied to the short plated metal projection. For example, copper or nickel over-plating uses a current density of about 0.005 amp/$cm^2$ (5 amps/$ft^2$) to about 0.08 amp/$cm^2$ (75 amps/$ft^2$) between about 25° C. and about 50° C., gold over-plating uses a current density of about 0.001 amp/$cm^2$ (1.0 amp/$ft^2$) to about 0.02 amp/$cm^2$ (20 amps/$ft^2$) between about 25° C. and about 50° C., and tin or tin/lead over-plating uses a current density of about 0.01 amp/$cm^2$ (10 amps/$ft^2$) to about 0.04 amp/$cm^2$ (40 amps/$ft^2$) between about 25° C. and about 50° C.

Figure 2A:
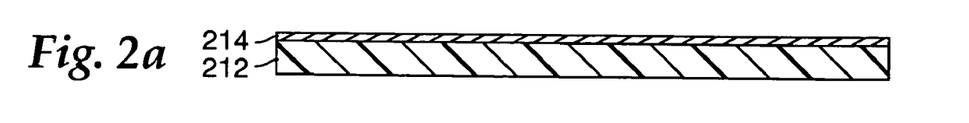
FIGS. 2a–2h illustrate another method of the present invention.
Figure 2B:
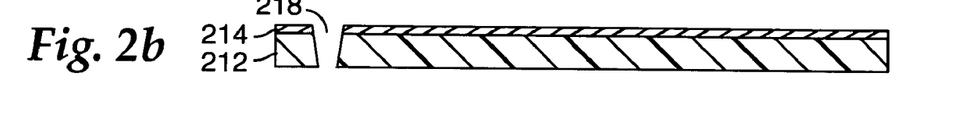
Figure 2C:
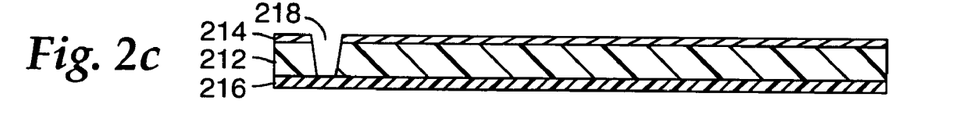
Figure 2D:
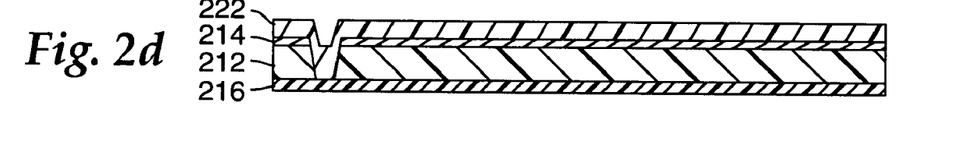

An alternative process according to the present invention is illustrated by FIGS. 2a–2h. This process involves using a layer of polymer instead of a layer of metal as a backstop for filling of vias. The polymer may be photoresist or any other suitable non-conductive polymer. As illustrated in FIG. 2a, the first step is providing a dielectric film material 212 having a layer of metal 214 on one side, such as a layer of APICAL 2HP polyimide laminated to a layer of copper, typically about 1 to 5 μm thick. Laser ablation or an equivalent hole-forming method such as mechanical drilling is used to form vias 218 extending through the two-layer material, as illustrated in FIG. 2b. Following formation of a desired via pattern, a polymer layer 216 is applied to the side of the dielectric film opposite the metal layer, as illustrated in FIG. 2c. Application of the polymer layer closes off one side of the vias, thereby producing cavities having substantially planar bottom surfaces in the dielectric film material. The polymer layer serves as a barrier or stop layer for subsequent deposition steps and shapes the material being deposited as it accumulates in the via. Conductive seeding (not shown) is then performed as described in the previous process with regard to chemically milled cavities. As illustrated in FIG. 2d, metal is then plated to form layer 222, which fills each cavity. The plated metal may also cover portions of metal layer 214 (as shown), to form metal traces and other metal circuit features.

Figure 2E:
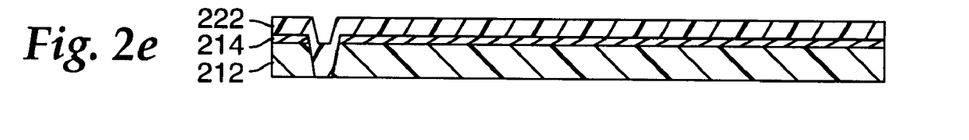

The polymer layer 216 is then removed, thereby exposing the plated metal material in the via 218. The height of the exposed metal surface is level with the height of the dielectric layer 212, as illustrated in FIG. 2e.

Figure 2F:
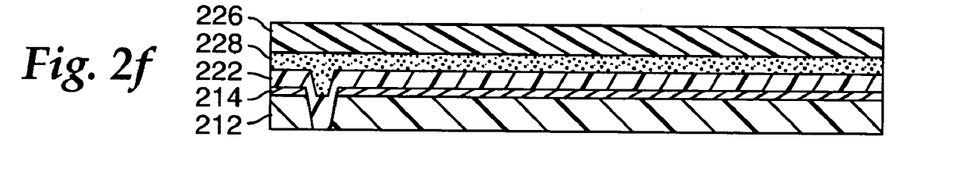
Figure 2G:
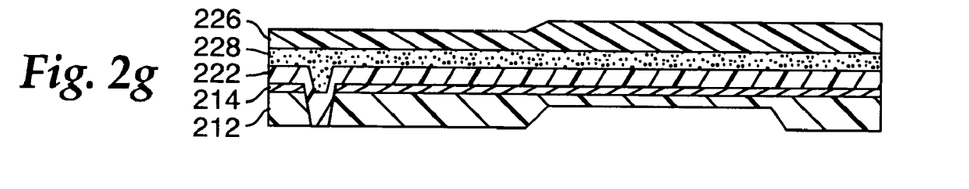
Figure 2H:
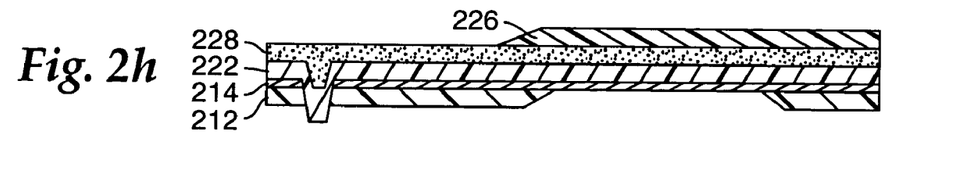

Further processing of this structure to form a conductive bump will be explained below. However, the process may include optional intermediate steps as illustrated by FIGS. 2f–2g (and portions of 2h). A cover layer of dielectric film 226 may be laminated over the plated (and patterned) metal layer, bonded to the metal with an adhesive 228 or directly attached, to produce circuit features that are embedded between the dielectric film and the cover layer materials, as illustrated in FIG. 2f.

Thereafter, as illustrated in FIG. 2g, application of photoresist and pattern development may be used to expose portions of dielectric film and/or the cover layer to be thinned according to the process described in copending, commonly-owned U.S. patent application Ser. No. 10/235465. The thinning process may even be used to selectively remove dielectric material from the side of the dielectric film that was previously protected by the polymer layer 216. In fact, portions of the dielectric layer may be removed to expose metal layer 214, thereby forming a connect surface 230 (shown in FIG. 2h). If it is not desired to reduce the thickness of the dielectric film around the filled cavity, this area of the structure may be covered with photoresist.

As with the present invention, exemplary chemical milling reagents contain about 45% aqueous hydroxide or a mixture of 40% potassium hydroxide and 20% ethanolamine. Appropriate selection of the bonding adhesive between dielectric films provides a stop layer that protects underlying circuit features because it is not dissolved by the chemical milling reagent.

As illustrated in FIG. 2h, the thickness of the dielectric film around the filled cavity may be reduced at the same time as the reduction in thickness of adjacent areas of dielectric material. As the thickness of the dielectric film decreases, the plated metal in the via protrudes from the dielectric film surface as a conductive projection having a planar surface. The surface is substantially equal in area to, or smaller than, the diameter of the via (depending on the slope of the via walls). Optional reshaping and augmentation of the metal projection may be performed by application of additional conductive material as described above.

In at least some embodiments of the present invention, because the conductive bumps protruding from the dielectric substrate are formed as the reverse image of the patterned dielectric, substantially perfect registration between the conductive bumps and dielectric layer is a consequence of the bump formation. This is in contrast to many conventional approaches for producing conductive features surrounded by dielectric material, e.g, using photoimageable material or printed solder masks, which often require two separate process steps: one for patterning the conductive bumps and one for patterning the dielectric layer. In these conventional approaches, misregistration between the two patterned constructions is often a problem and can require design constraints sufficient to assure a minimum registration tolerance. As explained above, at least some embodiments of the present invention substantially eliminate the need for this type of design constraint.

Planar bump formation according to the present invention has application to a wide variety of printed circuits, multi-layer circuits, flexible circuits and connecting structures including contact sets and interposers that require fine pitch, high density interconnection capability. The process steps outlined above allow formation of bumped flex structures including large arrays of conductive bumps. High density interconnects, produced as described, offer advantages over some existing commercial interconnect systems, which provide contacts having less available contact surface area than planar conductive bumps according to the present invention.

Figure 5A:
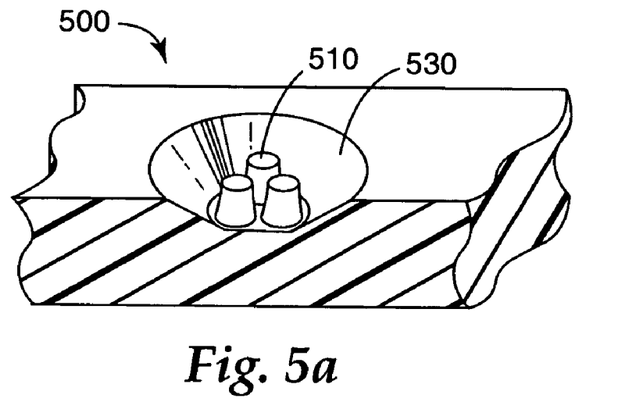
FIGS. 5a and 5b are a schematic representation of sensors containing conductive bumps of the present invention in an open reservoir and channel, respectively.
Figure 5B:
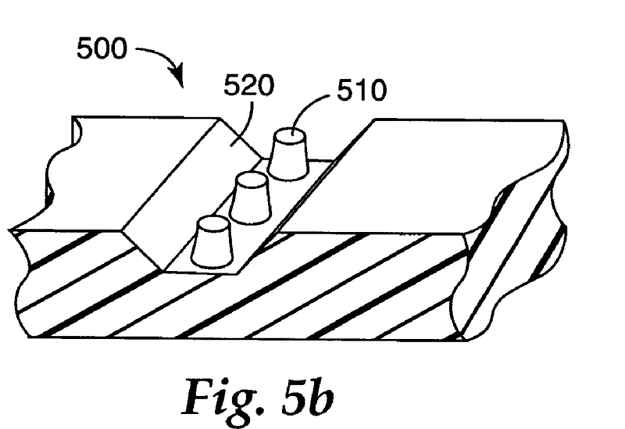

FIG. 5a is a schematic representation of a sensor 500 containing at least one conductive bump 510 of the present invention in an open well or reservoir 530. FIG. 5a is a schematic representation of a sensor 500 containing at least one conductive bump 510 of the present invention in an open channel 520. The difference between the open well and open channel configurations is the shape of the indention made in the dielectric film around the conductive bumps. These indentions may be of any shape that can be produced readily by conventional photo-imaging processes including truncated cones (FIG. 5a), truncated cylinders, polyhedrons, channels, and combinations thereof.

The at least one conductive bump may be used as an electrode, for example in an electrochemical sensor. The sensor may interface with a measurement device (not shown) that measures the electrochemical reaction between an analyte and reagent in contact with the sensor electrodes.

To form the sensor electrode, the conductive bump can be formed as shown in FIGS. 1a–1d. However, to form the well around the electrode, the dielectric material surrounding the bumps must be selectively removed without decreasing the thickness of the dielectric film in the area outside of the well. To accomplish this, a layer of photoresist is laminated to metal layer 114. The photoresist is then patterned to define the wells around the conductive bump electrodes by exposure to UV light through a phototool or mask. The photoresist is then developed with 75% aqueous solution of sodium carbonate to obtain the desired image of the circuit pattern.

PERMA-ETCH from Electrochemical Inc. can then be used to etch away the exposed portions of metal layer 114 to uncover the region of the dielectric film to be etched. The dielectric film, which can be LCP, polycarbonate, or polyimide, can then be etched using a 35–55% KOH solution at 70–95° C. to form the well around the conductive bumps.

This partial etching method creates the well and exposes the sides of the copper plug plated in the via, thus forming a copper bump protruding to a height of 30 $\mu$m from the polyimide dielectric surface at the bottom of the well. Additional copper may be plated to slightly increase the bump height and to form a cap to increase the total thickness by 0.5–2 $\mu$m.

The well may be of any given shape including the truncated cone (frustum) shown in FIG. 5a or the channel shown in FIG. 5b, and have a depth that is up to 0.75% of the thickness of the original dielectric film. The conductive bump(s) may be of any shape including cylinders, truncated cones, polyhedrons, or combinations thereof. The height of the bumps will generally extend to the plane created by the unetched surface of the dielectric film. Additional copper may be plated to slightly increase the bump height and to form a cap on the bump. Alternatively, the height of the bumps may be reduced by performing a second metal etch step.

Figure 6:
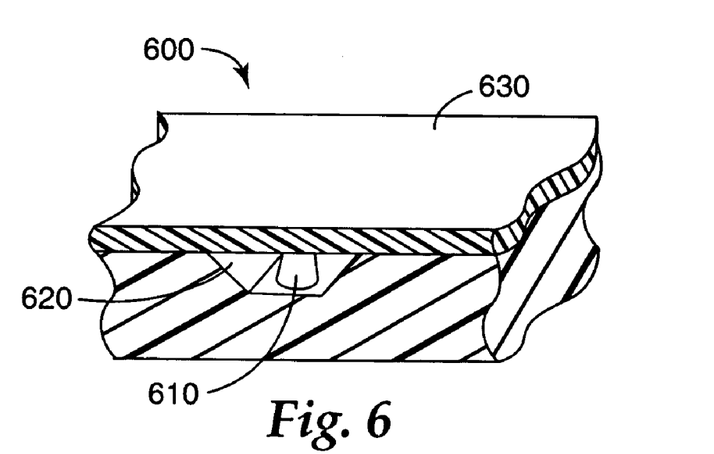
FIG. 6 is a schematic representation of a sensor containing conductive bumps of the present invention in a closed channel.

FIG. 6 is a schematic representation of a sensor containing conductive bumps of the present invention in a closed channel. A cap layer 630 has been added to the surface of the dielectric film over an etched channel. The cap layer may be a thermoplastic film, a tape or adhesive layer, which has been laminated to the first surface of the conductive film. The cap layer may be solid or have openings through its thickness. A cap layer may also be added over a well or reservoir, such as that shown in FIG. 5a. In addition, when a conductive bump exists in a channel or well that is covered with a cap layer, the conductive bumps can serve as structural supports for the cap layer to prevent it from collapsing or sagging.

An exemplary process for making a circuit of the present invention includes the following. A 50 $\mu$m thick APICAL HPNF polyimide dielectric film from Kaneka is provided. A first copper seed layer is sputtered onto a first side of the polyimide film at the thickness range of 50–200 nm, followed by first flash copper plating up to a total thickness of 0.5–3 $\mu$m. Optionally, a first chrome or nickel-chrome tie layer may be vacuum deposited before the deposition of the first copper seed layer.

Subsequently, photoresist such as those available under the trade name SF320 or SF310 from MacDermid is laminated on the second (unmetallized) side of the polyimide film. The photoresist is patterned to define via openings by exposure to ultraviolet (UV) light through a phototool or mask, then developed with a 0.75% aqueous solution of sodium carbonate to obtain the desired image of the via pattern. Vias are formed by chemically etching the polyimide film from its second side using 35–55% KOH solution heated to a temperature of 70–95° C. The first flash copper layer serves as an etch stop for the chemical etching of the vias. The photoresist layer is removed after the vias are etched.

Once the vias are formed, a second chrome or Ni—Cr tie layer is sputtered onto the second side of the polyimide film (including in the via openings) to a thickness range of about 5–30 nm. A second copper seed layer is then sputtered onto the second chrome tie layer to a thickness of about 50–200 nm.

A photoresist is laminated to the first flash Cu layer and then, second copper seed layer is plated with copper to form a second flash copper layer having a thickness of about 0.5–3 $\mu$m.

Photoresist is laminated to the second flash copper layer and patterned to define circuitry (circuit traces or leads, bond pads and the like) and via entrances by exposure to UV light through a phototool or mask, then developed with 0.75% aqueous solution of sodium carbonate to obtain a desired image of circuitry pattern. Additional copper is then electroplated onto the second flash copper layer to form the final circuit leads and copper plugged vias to thicknesses of about 20–40 $\mu$m.

A dilute KOH solution at 3–8% is used to remove the photoresist from both sides of the dielectric film. A metal etchant available as PERMA-ETCH from Electrochemical Inc., is then used to etch away all exposed copper on both sides of the polyimide revealing a surface of the plated metal filling the via (which will become the top surface of the bumps) on the second side of the dielectric and discrete circuit traces on the first side of the polyimide dielectric. Copper circuit leads will connect with the vias, which are plugged with solid copper during the circuit plating process.

A photoresist is laminated to the copper circuit side on the second side of the dielectric film as a protective layer followed by dielectric etching of the entire first polyimide side using 35–55% KOH solution at 70–95° C. to reduce the entire polyimide film thickness from an original thickness of about 50 $\mu$m to a final thickness of about 20 $\mu$m. Alternatively, a second layer of photoresist may be applied to the first polyimide side and patterned to define specific areas where the dielectric film is to be thinned.

The height of the copper via exits remains unchanged during polyimide etching. Therefore, 30 $\mu$m tall copper bumps protrude out of the etched polyimide surface through the remaining 20 $\mu$m thick polyimide film and are connected by the copper circuit leads on the circuit side. All copper bumps have substantially same height, which is determined by the original thickness of the dielectric film. Additional copper may be plated to slightly increase the bump height and to form caps increasing the total thickness by 0.5–2 $\mu$m.

Subsequently, a nickel layer may be plated onto the exposed copper bump from a nickel sulfamate solution containing about 300 grams of nickel sulfamate per liter, at 20 amps per square foot to a thickness of about 3 $\mu$m. Finally a gold surface layer may plated onto the nickel layer from a gold cyanide solution containing about 1.7 Troy ounce of gold per gallon of ammonium gold cyanide solution, at 3 amps per square foot to a thickness of about 1 $\mu$m.

EXAMPLE

A 50 $\mu$m polyimide film, available under the trade name APICAL 2HP from Kaneka, Tokyo, Japan, and having a 3 $\mu$m thick layer of copper laminated to a first side of the polyimide film was provided. 25 $\mu$m diameter vias were formed through the laminate by ablation with a YAG laser. A 38 $\mu$m layer of photoresist (SF315 provided by MacDermid of Waterbury, Conn.) was applied to the second side of the dielectric film, which closed off one end of the vias. A conductive suspension of carbon available under the trade name SHADOW CONDUCTIVE COLLOID 2 from Electrochemical Inc., Maple Plain, Minn.) was applied in an immersion bath to the via sidewalls.

Subsequently, an additional layer of photoresist was laminated on the first side of the substrate. The photoresist was patterned to define circuit traces and space features by being exposed to ultraviolet (UV) light through a phototool or mask, and then developed with 75% aqueous solution of sodium carbonate to obtain the desired image of circuitry pattern. A 15 $\mu$m thick layer of copper was then electroplated from a copper sulfamate solution over the seed layer to fill the via and form a trace layer on the first side of the laminate.

A dilute KOH solution at about 3–5% was used to remove the photoresist from both sides of the patterned substrate. PERMA-ETCH from Electrochemical Inc. was used to etch away the flash copper on the first side and about 3 $\mu$m thick flash copper from the second via side. Now polyimide surface was exposed after the first sided copper removed. A photoresist was laminated to the first side of the substrate having the circuit traces thereon to protect the first side, followed by polyimide film etching using about 45% KOH solution at about 90° C. to reduce the overall thickness of polyimide film from about 50 $\mu$m to about 20 $\mu$m. (An alternate process sequence could include providing an additional layer of photoresist on the second side of the patterned substrate, imaging and patterning of the photoresist layer to produce partially thinned polyimide in selective regions as shown in FIG. 2g.)

This partial etching step exposed the bottom side of the copper that had been plated in the via, thus forming a copper bump protruding to a height of 30 µm from the polyimide dielectric surface. (Additional copper may be plated to slightly increase bump height and to form mushroom shape with about 0.5–2 µm in total thickness.)

Subsequently, nickel was plated onto the exposed copper bump from a nickel sulfamate solution at 20 amps per square foot to a thickness of about 3 µm. Then gold was plated onto the nickel from a gold cyanide solution at 3 amps per square foot to a thickness of about 1 µm. A number of arrays of conductive copper bumps in a flexible dielectric film were produced using the process described above. Bump diameters from about 75 µm (0.75 mm) to about 125 µm (1.25 mm) were developed for bumps having a rounded profile. Other bumps having diameters of about 150 µm (1.50 mm) to about 200 µm (2.0 mm) were produced with substantially planar surfaces that offered larger surface areas for contact with mating connectors. Over plating is used to form the rounded profile while the flat profile may be formed by eliminating the overplating step. Spacing between bumps, regardless of size or shape, varied from about 125 µm (1.25 mm) to about 250 µm (2.5 mm).

Bump height of several bump array samples was measured using a profilometer available under the trade name DEKTAK from Veeco/Sloan Technology, Santa Barbara, Calif. The measurements indicated uniform bump height and flat dielectric substrate surface. Profilometer scans for flat top bump samples revealed bump heights of about 25 µm (0.25 mm).

It will be appreciated by those of skill in the art that, in light of the present disclosure, changes may be made to the embodiments disclosed herein without departing from the spirit and scope of the present invention.

What is claimed is:

1. A process for forming a conductive bump protruding from a dielectric film, said process comprising:
   providing a dielectric film having a first side and a second side;
   applying a stop layer to at least said first side of said dielectric film, said stop layer having an underside in contact with said first side of said dielectric film;
   forming a cavity in the dielectric film that extends through said dielectric film from said second side of said dielectric film to said stop layer;
   depositing conductive material to form a conductive plug in said cavity;
   removing said stop layer from said first side of said dielectric film to expose a surface of said conductive plug;
   controllably etching said dielectric film from around said conductive plug surface to form said conductive bump protruding from said dielectric film.

2. The process of claim 1 further comprising depositing metal on said metallic projection to produce said conductive bump extending out from said metallic projection to cover a portion of said etched surface.

3. The process of claim 1, wherein said controllably etching said dielectric film uses a chemical milling reagent including an alkali metal hydroxide.

4. The process of claim 3, wherein said chemical etching reagent further includes an amine.

5. The process of claim 4, wherein said alkali metal hydroxide is potassium hydroxide and said amine is ethanolamine.

6. The process of claim 1 further comprising depositing metal on said conductive bump such that it extends out in x and y directions to cover a portion of said etched dielectric surface.

7. The process of claim 1 wherein an array of cavities are filled with metal plugs and the controlled etching provides an array of co-planar metallic projections.

8. The process of claim 1 wherein an array of cavities are filled with metal plugs and the controlled etching provides an array of metallic projections surrounded by a dielectric mask.

9. The process of claim 1, wherein said stop layer is a metal layer.

10. The process of claim 1, wherein said stop layer is a flash-plated metal layer.

11. The process of claim 1, wherein said dielectric film comprises a polymer selected from the group consisting of liquid crystal polymers, polycarbonates, and polyimide copolymers including carboxylic ester structural units in the polymeric backbone.

12. The process of claim 11, wherein said liquid crystal polymers are selected from the group consisting of copolymers containing p-phenyleneterephthalamide and copolymers containing p-hydroxybenzoic acid.

13. The process of claim 11, wherein said polyimide copolymers comprise the reaction product of monomers including p-phenylene bis(trimellitic acid monoester anhydride).

14. A process for forming a conductive bump protruding from a dielectric film, said process comprising:
    providing a dielectric film having a first side and a second side;
    forming an opening in the dielectric film that extends through said dielectric film from said first side to said second side of said dielectric film;
    applying a stop layer to said second side of said dielectric film such that said opening is closed off by the stop layer on the side of the opening adjacent the second side, thereby forming a cavity;
    depositing conductive material to form a conductive plug in said cavity;
    removing said stop layer from said second side of said dielectric film to expose a surface of said conductive plug;
    controllably etching said dielectric film from around said conductive plug surface to form said conductive bump protruding from said dielectric film.

15. The process of claim 14 further comprising depositing metal on said conductive bump such that it extends out in x and y directions to cover a portion of said etched dielectric surface.

16. The process of claim 14 wherein an array of cavities are filled with metal plugs and the controlled etching provides an array of co-planar metallic projections.

17. The process of claim 14 wherein an array of cavities are filled with metal plugs and the controlled etching provides an array of metallic projections surrounded by a dielectric mask.

18. The process of claim 14, wherein said stop layer is a polymer resin layer.

19. The process of claim 14, wherein said dielectric film comprises a polymer selected from the group consisting of polycarbonate polymers, liquid crystal polymers, and polyimide polymers including carboxylic ester structural units in the polymeric backbone.

20. The process of claim 19, wherein said liquid crystal polymers are selected from the group consisting of copolymers containing p-phenyleneterephthalamide and copolymers containing p-hydroxybenzoic acid.

21. The process of claim 19, wherein said polyimide copolymers comprise the reaction product of monomers including p-phenylene bis(trimellitic acid monoester anhydride).

22. The process of claim 14 further comprising depositing metal on said metallic projection to produce said conductive bump extending out from said metallic projection to cover a portion of said etched surface.

23. The process of claim 14, wherein said controllably etching said dielectric film uses a chemical milling reagent including an alkali metal hydroxide.

24. The process of claim 23, wherein said chemical etching reagent further includes an amine.

25. The process of claim 24, wherein said alkali metal hydroxide is potassium hydroxide and said amine is ethanolamine.

* * * * *

UNITED STATES PATENT AND TRADEMARK OFFICE
CERTIFICATE OF CORRECTION

| | | |
|---|---|---|
| PATENT NO. | : 7,012,017 B2 | Page 1 of 1 |
| APPLICATION NO. | : 10/791966 | |
| DATED | : March 14, 2006 | |
| INVENTOR(S) | : Dennis M. Brunner | |

It is certified that error appears in the above-identified patent and that said Letters Patent is hereby corrected as shown below:

TITLE PGE. ITEM (56) (U.S. Patent Documents), line 16, delete "6,611,046 B1" and insert -- 6,611,046 B2 --, therefore.

TITLE PGE. ITEM (56) (Other Publications), line 4, delete "reliabilty"," and insert -- reliability", --, therefore.

TITLE PGE. ITEM (56) (Other Publications), line 4, delete "publication" and insert -- publication, --, therefore.

Column 1, line 50, delete "bum" and insert -- burn --, therefore.

Column 7, line 49, delete "filly" and insert -- fully --, therefore.

Signed and Sealed this

Seventeenth Day of October, 2006

JON W. DUDAS
*Director of the United States Patent and Trademark Office*